United States Patent [19]

Corman et al.

[11] 3,852,804

[45] Dec. 3, 1974

[54] DOUBLE-SIDED HEAT-PIPE COOLED POWER SEMICONDUCTOR DEVICE ASSEMBLY

[75] Inventors: James C. Corman; Michael H. McLaughlin, both of Scotia; Gunnar E. Walmet, Schenectady, all of N.Y.

[73] Assignee: General Electric Co., Schenectady, N.Y.

[22] Filed: May 2, 1973

[21] Appl. No.: 356,565

[52] U.S. Cl. .................... 357/82, 165/80, 165/105, 174/15, 357/78

[51] Int. Cl. .......................... H01l 3/00, H01l 5/00

[58] Field of Search .......... 317/234, 1, 1.5; 174/15; 165/80, 105

[56] References Cited

UNITED STATES PATENTS

| | | | |
|---|---|---|---|
| 3,143,592 | 8/1964 | August | 317/234 B |
| 3,396,316 | 8/1968 | Wislocky | 317/234 D |
| 3,651,865 | 3/1972 | Feldmanis | 317/234 B |
| 3,654,529 | 4/1972 | Lord | 317/234 |
| 3,673,306 | 6/1972 | Kirkpatrick | 317/234 B |
| 3,736,474 | 5/1973 | Sias | 317/234 D |
| 3,739,234 | 6/1973 | Bylund et al. | 317/234 B |
| 3,739,235 | 6/1973 | Kessler | 317/234 B |
| 3,746,947 | 7/1973 | Yamamoto et al. | 317/234 A |

OTHER PUBLICATIONS

IBM Technical Disclosure Bulletin; Magnetic Wickless Heat Pipe; Vol. 13, No. 11, April 1971, page 3445.

*Primary Examiner*—Andrew J. James
*Attorney, Agent, or Firm*—Louis A. Moucha; Joseph T. Cohen; Jerome C. Squillaro

[57] ABSTRACT

A power semiconductor device is in pressure contact on its two major surfaces with bottoms of two thin cup-like members of copper which have electrically insulating material formed along their outer side surfaces to increase the creepage path across the semiconductor device. This assembly is readily replaceable and is mounted by slip joints between two pressure plates which are clamped together and formed the evaporating surfaces of two nonwicked gravity-return heat pipes.

14 Claims, 3 Drawing Figures

DOUBLE-SIDED HEAT-PIPE COOLED POWER SEMICONDUCTOR DEVICE ASSEMBLY

Our invention relates to a mounting assembly for a power semiconductor device which is used in conjunction with heat pipe cooling, and in particular, to an assembly which permits easy removal of the device that includes thin cup-like members of a thermally conductive material on which are formed an increased creepage path across the semiconductor device.

Semiconductor devices of various types are constantly being fabricated in larger sizes for power applications as distinguished from signal applications. The larger size of the device and higher current and power rating thereof requires an efficient means for removal of the heat generated within the device to maintain operation thereof within its rated steady-state and transient temperature limits. Since the future trend undoubtedly will be to increase the power rating of semiconductor devices even beyond those presently utilized, it is readily apparent that more efficient cooling means must be provided for such power devices.

Conventional cooling systems for power semiconductor devices are generally in the form of a finned heat sink which uses conduction heat transfer within the body of the heat sink as the means for transferring heat from the semiconductor device. An inherent limitation on the conventional finned heat sink performance results from the inefficiency in conduction heat transfer as the heat-transfer length (length of finned section and fin height) is increased. The semiconductor device-to-ambient thermal resistance possesses a conduction limit such that with a fixed cooling air flow velocity, adding more finned surface area by increasing the finned length or increasing the fin height, or with a fixed geometry, increasing the cooling air flow velocity, does not further decrease the thermal resistance.

Thus, one of the principal objects of our invention is to provide an improved cooling system for power semiconductor devices which is superior to the conventional finned heat sink system.

Another object of our invention is to provide the improved cooling system with superior steady-state and transient characteristics as compared to the conventional finned heat sink system.

Heat pipes are known devices for effecting heat transfer by vaporization of a liquid phase of a two-phase liquid coolant contained within a sealed chamber or pipe, by the application of heat to a vaporization, or evaporator, section of the chamber. The vaporization section of the heat pipe thus receives heat from the device being cooled and the heated vapor, being under a relatively higher vapor pressure, moves to the lower pressure area in the condensation section of the chamber, or pipe by a substanially isothermal process wherein the vapor condenses and the condensate returns to the evaporator section to be vaporized again and, thus, repeat the heat transfer cycle. The condenser section of the heat pipe is, in effect, an air-cooled surface condenser functioning to reject heat to ambient air. A wick material disposed along substantially the entire inner surface of the heat pipe is conventionally used to pump the condensate to the vaporization section of the heat pipe by capillary action. Since the heat pipe does not utilize conduction as the heat transfer process (except for transferring the heat into and out of the heat pipe), and thereby overcomes the limitations inherent with the conventional finned heat sink due to its reduced efficiency of conduction heat transfer with increased path length, this suggests that the heat pipe may be a superior type device for use in cooling power semiconductor devices.

Therefore, another object of our invention is to provide an improved power semiconductor device assembly which uses heat-pipe cooling.

A further object of our invention is to provide an improved heat-pipe cooled power semiconductor device assembly wherein the power semiconductor device is a readily replaceable unit.

The use of heat pipes for cooling power semiconductor devices has recently become known. The first use of heat-pipe cooling of power semiconductor devices known to us is by Heat-Pipe Corporation of America of Westfield, N.J. whose sales brochure generally describes heat pipes as being used to transport heat from electric motors, semiconductors, brakes and clutches and other heat producing devices. A publication prepared by the RCA Corporation at Lancaster, Pa. as a final technical report under contract DAAKO2-69-C-0609 dated October 1972 discloses heat-pipe cooled semiconductor thyristor devices. This assembly, however, does not have our assembly's capability for removal of the semiconductor device, that is, if the semiconductor device must be replaced, the heat pipe is also lost since the wick is integral therewith. The use of a wicked heat pipe in the RCA assembly introduces high thermal losses and the wick pumping losses increase with length thereby limiting the length of heat pipe that may be effectively used. Our invention uses a nonwicked heat pipe. Finally, the RCA assembly has the wick in direct contact with the semiconductor device which does not permit any significant heat storage during heat transients. Thus, during a heat transient the RCA assembly would not appear to be able to reduce the resulting temperature rise due to the wick temperature rising at almost the same rate as the heat transient, and probably resulting in the wick material drying out. Our assembly uses a pressure plate as an interface between the semiconductor device and evaporator section of the heat pipe to obtain heat storage during transients. Finally, heat-pipe cooling of power semiconductor devices is also disclosed in a paper entitled APPLICATION OF HEAT PIPES TO THE COOLING OF POWER SEMICONDUCTORS by Edward J. Kroliczek of the Dynatherm Corporation of Cockeysville, Md. which describes the mounting of a power semiconductor device to a heat pipe which is distinguished from our invention in that a wicked heat pipe is utilized in the Dynatherm assembly. Also, the Dynatherm assembly uses two heat pipes for single-sided cooling, each being of small size in cross-section and of flat configuration which also significantly increases the thermal resistance. The orientation of the small heat pipes relative to the large cooling fins in the Dynatherm assembly also results in poor heat distribution since conduction heat transfer is required in transferring the heat laterally from the edges of the heat pipes to the outer portions of the fins.

Therefore, another object of our invention is to provide an improved heat-pipe cooled power semiconductor device assembly which uses a nonwicked heat pipe.

A further object of our invention is to provide an improved heat-pipe cooled power semiconductor device assembly which has reduced thermal resistance and provides more efficient cooling capabilities.

In a concurrently filed patent application, Ser. No. 356,566 entitled HEAT-PIPE COOLED POWER SEMICONDUCTOR DEVICE ASSEMBLY having the same inventors and assigned to the same assignee as the present application, a replaceable power semiconductor device includes only the body of semiconductor material and support plates on either side thereof. Although such invention is satisfactory, it has been found that in replacing the semiconductor device one must often also replace an associated increased creepage path means and thereby add to the cost of the assembly.

Therefore, another object of our invention is to provide the improved heat-pipe cooled power semiconductor device assembly with a less costly replaceable power semiconductor device.

The assembly in our concurrently filed application is clamped together by means of nut-bolt assemblies in the manner of a conventional bolt ring. Although this clamping arrangement is satisfactory, some misalignment problems may occur with its use, and thus it would be desirable to utilize other clamping arrangements to provide sufficient clamping pressure and a higher degree of self-alignment of the assembly. Thus, a further object of our invention is to provide an improved clamping assembly for obtaining a higher degree of self-alignment of our heat-pipe cooled power semiconductor device assembly.

Briefly summarized, and in accordance with the objects of our invention, we provide a heat-pipe cooled power semiconductor device assembly which includes a power semiconductor device integral with an increased creepage path means. This integral semiconductor device unit is mounted between two pressure plates which are clamped together to form heat storage and pressure interfaces with the integral unit. The power semiconductor device is double-sided cooled and the pressure plates function as the bases and evaporating surfaces of two nonwicked heat pipes of the gravity-return type. The heat transfer capability of the pressure plate evaporating surfaces is enhanced by sintering a porous metallic material along the surface thereof or forming thereon a small fin surface as two examples. The clamping means for the two pressure plates is a large diameter threaded connection between the two heat pipes in a first embodiment and a plurality of nut-bolt assemblies in a second embodiment. The integral power semiconductor device unit is readily replaceable by removal of the clamping pressure applied to the pressure plates. The location of the evaporating surface of the heat pipe in relatively close proximity to the heat-emitting power semiconductor device decreases the steady-state thermal resistance as well as decreasing the transient temperature rise for long term heat overloads to thereby produce improved vaporization cooling of the device.

The features of our invention which we desire to protect herein are pointed out with particularity in the appended claims. The invention itself, however, both as to its organization and method of operation, together with further objects and advantages thereof may best be understood by reference to the following description taken in connection with the accompanying drawings wherein like parts in each of the several figures are identified by the same reference character, and wherein:

Figures 1, 2, 3:
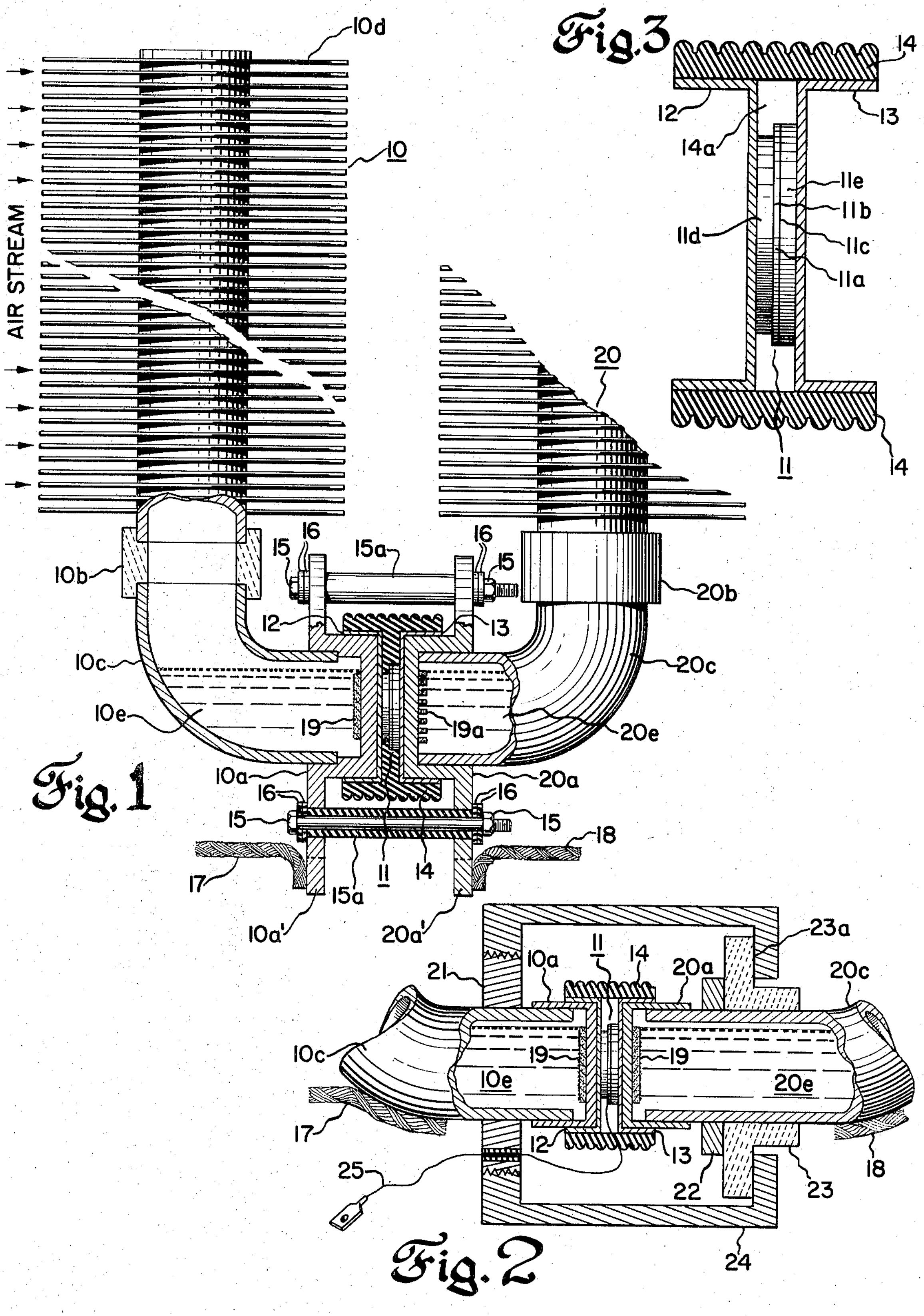
FIG. 1 is an elevation view, partly in section, of our heat-pipe cooled power semiconductor device assembly utilizing nut-bolt assemblies as the clamping means.
FIG. 2 is an elevation view, partly in section, of the portion of the assembly illustrated in FIG. 1 showing the integral power semiconductor device unit and utilizing a large diameter threaded connection between the two heat pipes as the clamping means; and, FIG. 3 is a fragmentary view of the integral power semiconductor device unit.

Referring now in particular to FIG. 1, there is shown a first embodiment of our invention wherein two nonwicked heat pipes of the gravity-return type, and designated as a whole by numerals 10 and 20, are used for obtaining double-sided cooling of a power semiconductor device shown as a whole by numeral 11. Power semiconductor device 11 is shown in enlarged view in FIG. 3 and is depicted in each of the FIGURES as a layered body including a body of semiconductor material 11*a* having first and second flat parallel major surfaces 11*b* and 11*c*, respectively, which define the body of semiconductor material therebetween. The fragile silicon junctions are protected against thermal and mechanical stresses by having the first major surface thereof 11*b* in pressure contact with a substantial support plate 11*d* fabricated of tungsten or moloybdenum as two typical metals. Thus, the power semiconductor device is defined herein as including semiconductor body 11*a* and support plates 11*d* and 11*e*. The second major surface 11*c* of the semiconductor body is brazed or otherwise bonded to support plate 11*e* which is slightly larger in diameter than plate 11*d*. This arrangement prevents cracking or other damage to the semiconductor body which could result from thermal expansion stresses caused by the excursion in junction temperature during transient operation which may be in the order of 200°C. The material of support plates 11 *d* and 11*e* must have good electrical and thermal conductivity, be of high strength and have a coefficient of thermal expansion substantially equal to that of the semiconductor material.

The power semiconductor device is defined herein as being a device which develops a thermal density of at least 100 watts per square inch along the surfaces thereof. The major surfaces of support plates 11*d* and 11*e* which are spaced from semiconductor body 11*a* are in pressure contact with the outer bottom surfaces of two thin cup-like members 12 and 13 fabricated of a good thermally and electrically conductive material such as copper. The side wall portions of cup members 12 and 13 provide support for a creepage path lengthening means 14 which is a rubber, a ceramic or other electrically insulating material formed along substantially the full height of the side walls of cup members 12 and 13 for increasing the creepage path across the semiconductor device 11 (as well as the two pressure plates to be described hereinafter to which electrical power conductors are connected). The increased creepage path means 14 may be a ceramic composition, or a silicone rubber composition such as the type RTV produced by the General Electric Company and is preferably formed with an irregular outer surface as best illustrated in FIG. 3 to obtain an even greater creepage path to prevent arc-over between the pressure plates. In the case of a silicone rubber composition 14, it preferably entirely fills the void between cup members 12 and 13 to thereby also provide a dirt-free seal around power semiconductor device 11 and such rubber composition is then run along the outer side surfaces of the cup members as indicated in FIG. 1 to obtain the increased creepage path between the pressure plates. In the case of a ceramic composition 14, as shown in FIGS. 2 and 3, the ceramic need not fill the entire void between the cup members 12 and 13, and may have a straight bore inner diameter and the remaining space 14*a* between the cup members is preferably back-filled with an inert gas such as nitrogen. The increased creepage path means 14, cup members 12 and 13 and power semiconductor device 11 thus form an integral structure which hereinafter will be described as the integral power semiconductor device unit.

The integral power semiconductor device unit is retained between a pair of pressure plates 10*a* and 20*a* by means of a slip joint along the inner side surfaces of cup members 12 and 13 and by a compression joint between the pressure plates which are clamped together for exerting a pressure in the order of approximately 2,000 lbs. per square inch uniformly against the power semiconductor device and cup members. A pressure of this magnitude provides pressure interfaces between pressure plate 10*a* and cup member 12, between cup member 12 and support plate 11*d*, between support plate 11*d* and the body of semiconductor material 11*a*, between support plate 11*e* and cup member 13, and between cup member 13 and pressure plate 20*a* which are of good thermal and electrical quality, that is, the smooth flat surfaces are uniformly in sufficient pressure contact to have negligible voids therebetween and thereby reduce thermal and electrical resistances to very low values in the order of 0.015°C - inch $^2$/watt and $20 \times 10^{-6}$ ohm, respectively. Thus, a total of five "dry" joints are present in our assembly. As a typical example of the dimensions encountered in the pressure interface portion of our heat-pipe cooled power semiconductor device assembly, the body of semiconductor material 11*a* has a thickness of 10 mils and a diameter of 2,000 mils for a 700 ampere, 1,200 volt rated semiconductor device, support plates 11*d* and 11*e* are each of approximately 40 mils thickness, pressure plates 10*a* and 20*a* are each of 100 to 300 mils thickness and cup members 12 and 13 are each of 25 to 100 mils thickness. Pressure plates 10*a* and 20*a* are fabricated of a metal having good electrically and thermally conductive characteristics such as copper, as one example. The clamping means for pressure plates 10*a* and 20*a* consists of a plurality of metallic nut-bolt assemblies 15 provided with suitable electrically insulating washers 16 wherein each bolt passes through aligned holes that have been formed in flange portions of pressure plates 10*a* and 20*a* as illustrated in FIG. 1. The flange portion of the pressure plates may be fabricated integral with the base portion as depicted, or may be fabricated separate from the base portion and then brazed, welded or otherwise joined thereto. The metal bolts are provided with suitable electrically insulating jackets 15*a* to prevent short-circuiting across the pressure plates through the bolts. A pair of electrical power conductors 17 and 18 are suitably connected to pressure plates 10*a* and 20*a* by being soldered to terminals 10*a*' and 20*a*' which are connected to the pressure plates or are formed as extending tab portions thereof as two examples.

The need for increasing the creepage path between pressure plates 10*a* and 20*a* should be evident in view of the small spacing between the pressure plates, which may be as small as in the order of 140 mils for the above-described dimensions and typical anode-to-cathode potentials of 1,200 volts applied across conductors 17 and 18. Our heat-pipe cooled power semiconductor device assembly may be mounted on a suitable bracket or other structure by means of one or more of the bottom portions of bolts 15 as one example.

The heat pipes 10 and 20 are each a sealed chamber or pipe which includes a vaporization or evaporator section that is placed in contact with the source of heat (the semiconductor device to be cooled) and a condensation section which is at the opposite end of the chamber and may be separated by a distance therefrom up to several feet. A two-phase fluid coolant is contained within the heat pipes and effects heat transfer by vaporization of a liquid phase of the coolant resulting from heat conduction through pressure plates 10*a* and 20*a* from the power semiconductor device 11 to the evaporator sections of the heat pipes. The vaporization section of each heat pipe thus receives heat from the device being cooled and the heated vapor, being under a relatively higher vapor pressure, moves to the lower pressure area in the condensation section of the heat pipe which functions as a surface condenser where the vapor condenses and the condensate returns to the evaporator section to be vaporized again and, thus, repeat the heat transfer cycle. The condensation section of each heat pipe has a relatively high thermal mass due to the large surface area thereof, and is provided with a finned heat exchanger to thereby function as an air-cooled surface condenser rejecting heat to ambient air which surrounds the condensation section. For more difficult removal of the heat to the ambient air, a fan or other means is utilized for obtaining forced air cooling by developing a sufficient air velocity of the ambient air passing by the cooling fins as depicted by the arrows in FIG. 1. In conventional heat pipes, a capillary pumping structure, or wick, is saturated with the liquid phase of the coolant and is used to "pump" the condensate to the evaporator section of the heat pipe by capillary action.

However, we have found that a wick is not essential to the operation of a heat pipe when it is of the gravity-feed type, that is, the heat pipe is oriented at some angle from the horizontal which need not be the extreme case of 90° indicated in FIG. 1. Conventional heat pipes are generally designed to operate in a horizontal orientation and within some range of angles from the horizontal. Each of the heat pipes illustrated in each of the above-identified publications is shown in a horizontal orientation, and, as such, require the wick for pumping the condensed fluid from the condensation section to the evaporator section. In the gravity-feed heat pipe, the condensed fluid returns to the evaporator section by gravity. The omission of the wick material along the various inner surfaces of our heat pipe results in reduced thermal resistance since the wick adds another thermal resistance (loss) component into the system. Further, the use of a wicked heat pipe limits the effective length of the heat pipe that may be used since the pumping losses associated with the wick increase with heat pipe length. For these reasons, we employ the gravity-return heat pipe in both the embodiments illustrated in FIGS. 1 and 2, and as a result obtain more efficient cooling under both steady-state and transient heat conditions.

Since the evaporating section (boiling surface) of each of our heat pipes is relatively small compared to the large surface area in the condensing section, it is desirable to increase such boiling surface area and/or change the local fluid flow patterns in order to obtain a greater maximum heat rejection rate from pressure plates 10*a* and 20*a* (and therefore also from semiconductor device 11). Therefore, for purposes of enhancing (increasing) the vaporization rate in our heat pipes, a means is formed along the major inner surface of each of pressure plates 10*a* and 20*a*, which forms one end of each heat pipe, for enhancing the boiling surface of the vaporization section of the heat pipes. This boiling surface enhancement means may be a layer structure 19 of uniform thickness in a range of 10 to 50 mils of a porous metallic material such as FOAMETAL, a product of Hogen Industries, Willoughby, Ohio, which is nickel having a selected porosity in the range of about 60 to 95 percent that is illustrated in FIG. 1 (and FIG. 2) as being sintered or otherwise joined to such inner surface of pressure plate 10*a*. Alternatively, this evaporating surface enhancement means may be small finned surface 19*a* (short finned structure) on the inner surface of pressure plate 20*a* as illustrated in FIG. 1 for increasing such boiling surface area. Since the heat pipes do not utilize conduction as the heat transfer process (except for transferring the heat into and out of the heat pipe walls), the heat transfer through the length of each heat pipe is a substantially isothermal process of evaporation and condensation whereby the condensation section of the heat pipe is at substantially the same temperature as the evaporation section. This heat transfer process is also known as vapor phase heat transfer. The most distinguishing feature of the heat pipe over the air cooled finned heat sink is its ability to transfer heat along its length with substantially no temperature change and thereby is much more efficient in its cooling ability than the conventional heat sink.

In FIG. 1, our gravity-feed heat pipes 10 and 20 are each illustrated as being vertically oriented (although as mentioned above, such orientation may be much less than 90° from the horizontal) and the sealed chambers of the heat pipes are defined by side walls 10*c*, 20*c*, the pressure plates 10*a*, 20*a* as one end wall at the evaporating sections and a suitable plug at each condenser section end. The heat pipe may be circular, square or rectangular as typical examples of the cross section thereof. The side wall is fabricated of a metal having a high thermal conductivity such a copper and has a thickness in the order of 40 mils. As a typical example, for a power semiconductor device having a steady-state electrical current rating of 700 amperes, each heat pipe is 8 inches in length and 1.5 square inches in cross sectional area. The plug may be fabricated of a compatible material such as copper and is suitably connected to the condenser section end of the heat pipe by brazing or any other well known metal joining process that assures a sealed chamber within the heat pipe. The side walls 10*c*, 20*c* of the heat pipes are also brazed or otherwise connected to provide the proper seal with the pressure plates 10*a*, 20*a*, respectively. The side walls 10*c*, 20*c* may be provided with electrically insulating collars 10*b*, 20*b* adjacent the evaporator section ends of the heat pipes in order to insulate the finned condensation sections of the heat pipes from the voltages applied through conductors 17, 18 to the pressure plates 10*a*, 20*a* and the adjacent lower-most portions of the side walls 10*c*, 20*c*, if such isolation is desired. Thus, each side wall 10*c*, 20*c* is generally in two sections separated by the insulating collar 10*b*, 20*b*, respectively.

The finned heat exchanger along the outer surface of the condensation section of each of our heat pipes consists of large fins 10*d* which may be of the folded fin or plate fin types and are fabricated of a high thermal conductivity material such as copper. The fins 10*d* extend outward from the side walls 10*c* of the heat pipe a distance generally in the range of 0.5 to 1.0 of the dimension between the opposing side walls to which they are connected. For ease of fabrication, the heat pipe is often rectangular in cross section and the cooling fins are of length equal to the long dimension side of the heat pipe and are attached therealong.

The liquid state 10*e* of the two-phase fluid coolant is of small volume, and merely of sufficient depth in the evaporator section of each heat pipe to fully immerse the "heated" portion of the boiling surface enhancement means 19 (or 19*a*) on the pressure plates. The coolant 10*e* may be water, or a freon refrigerant, as typical examples. In operation, the heat generated in power semiconductor device 11 is conducted through cup members 12 and 13 to pressure plates 10*a* and 20*a*, respectively, which have significant heat storage capabilities. Thus, in the case of heat transients, pressure plates 10*a* and 20*a* dampen the transient and thereby reduce the temperature rise in the semiconductor device below the peak value it would attain without the presence of the pressure plates. The heat is then conducted from the pressure plates to the evaporator surface enhancement means 19 (or 19*a*) at which points it vaporizes the liquid coolant 10*e*. The vapor coolant then moves to the condenser section of each heat pipe due to a differential vapor pressure and condenses into the liquid state which returns to the evaporator section under the force of gravity. The heat of condensation is absorbed by the heat pipe condensation section walls which due to the large surface area have a high thermal mass, and is conducted to the finned heat exchanger 10*d*, and finally to the ambient air which is flowing thereby at a relatively fast rate to obtain forced air cooling of the fins.

Referring now to FIG. 2, there is shown a second, and preferred embodiment of the clamping means utilized for clamping the pressure plates 10*a*, 20*a* together. The clamping means is essentially a large diameter threaded connection between the two heat pipes 10 and 20. The threaded connection may conveniently be made as follows: Assuming a circular cross section of the evaporator section end of each heat pipe, a circular projecting member or collar 21 is brazed or otherwise joined to the outer surface of the side wall 10*c* adjacent the evaporator section end of heat pipe 10. Collar member 21 is threaded along its outermost surface. A second collar member 22 is brazed or otherwise joined to the outer surface of side wall 20*c* adjacent the evaporator section end of heat pipe 20. Collar member 22 is not threaded. An L cross-section sleeve member 23 is retained along the outer surface of side wall 20*c* fairly snugly but with the ability to rotate and is retained in its maximum inward position by collar member 22. The inner surface 23*a* of the projecting portion of the L-shaped sleeve member provides a bearing surface for a large diameter, rotatable, U-shaped member 24 which has the form of a hollow right cylinder with the central portions of the top and bottom ends removed. The length of member 24 is sufficient to span the distance from collar member 21 to sleeve member 23. The left end of member 24, as viewed in FIG. 2, is threaded for mating with the threaded portion of collar member 27. The inner surface of the right end of member 24 bears against surface 23*a* of sleeve member 23 which thus functions as a washer. Member 24 is rotated in one direction for applying the desired pressure against the integral power semiconductor device unit, and is rotated in the opposite direction when removal of such unit is desired. This large diameter threaded connection permits application of a greater clamping pressure than can be achieved in the FIG. 1 embodiment. But even more importantly, this large diameter threaded connection provides a higher degree of self-alignment of the pressure interfaces between the pressure plates and integral power semiconductor device unit than can be obtained with the bolt ring assembly used in FIG. 1, and therefore is the preferred embodiment. Finally, in the case wherein the power semiconductor device is of the three electrode type, the third electrode (generally described as the gate or control electrode) is provided with connection to a third electrical conductor 25 which may be brought out at the side of device 11 and through stationary collar member 21. Power conductors 17 and 18 may conveniently be connected to the side walls 10*c* and 20*c*, respectively, as illustrated.

It is apparent from the foregoing that our invention obtains the objectives set forth in that it provides a cooling system for power semiconductor devices which is significantly superior to the conventional finned heat sink system both as to its steady-state and transient response characteristics. The elimination of the wick in our gravity-feed heat pipe removes one source of undesired thermal resistance and a possible limitation on total power handling capacity to thereby obtain a more efficient heat-pipe cooled power semiconductor device assembly. The heat-pipe interfaces with the integral power semiconductor device unit is obtained by two pressure plates for obtaining double-sided cooling. The pressure interfaces developed between the pressure plates, cup members, and the semiconductor device provide a good thermal and electrical conduction path therebetween. The location of the enhanced evaporating surface 19 or 19*a* in close proximity to the heat-emitting power semiconductor device (i.e., spaced by the thickness of the pressure plate and cup member) also decreases the steady-state thermal resistance as well as decreasing the transient temperature rise for long term heat overloads to thereby provide improved vaporization cooling of the power semiconductor device. This decreased steady-state thermal resistance results in the condenser section of our heat pipes being able to transfer heat to the ambient with greater efficiency than with conventional finned heat sinks or with the other heat-pipe cooled power semiconductor device assemblies enumerated above in the published art. The decreased steady-state thermal resistance is due also to the fact that the pressure plate is of relatively thin dimension compared to the conventional copper heat sinks of much thicker dimension previously utilized. The decreased transient temperature rise is also obtained by the fact that the walls of the heat pipe and the fluid coolant can store the heat upon the two-phase fluid evaporating in the evaporator section of the heat pipe and therefore the heat pipe walls and fluid also provide a damping of temperature rises which are of the transient type. Also, the clamping means for clamping the pressure plates together (especially in the case of the large diameter threaded connection) results in a high degree of self-alignment of the assembly and a very convenient means for removing the integral power semiconductor device unit and these self-alignment and unit replaceable features are also important aspects of our invention. And since the integral power semiconductor device unit includes the increased creepage path means, less cost is involved when a heat pipe must be replaced. Finally, the electrically insulating collars 10*b*, 20*b* permit the forced air-cooled portions of our assembly to be outside a cabinet in which the semiconductor device 11 and pressure plates may be mounted, and such finned portions 10*d* would thus be electrically isolated from the high voltage applied to the semiconductor body. Also, these electrically insulating collars permit the cooling fins 10*d* to be exposed to dirty air without the possibility of increased surface conduction along the creepage path around the semiconductor body that occurs with conventional finned heat sinks or heat pipes not having such collars and operating in dirty air.

Having described two embodiments of our double-sided heat-pipe cooled power semiconductor device assembly, it is believed obvious that modification and variation of such specific embodiments may readily be made by one skilled in the art. Thus, the assembly may readily be utilized as a single-sided cooled assembly by removing one of the heat pipes. It is, therefore, to be understood that changes may be made in the gravity-feed heat-pipe power semiconductor device assembly which are within the full intended scope of our invention as defined by the following claims.

What we claim as new and desire to secure by Letters Patent of the United States is:

1. A heat-pipe cooled power semiconductor device assembly comprising an integral power semiconductor device unit including a power semiconductor device consisting of a body of semiconductor material defined by first and second flat parallel major surfaces, and first and second support plates having first major surfaces forming interfaces with the first and second flat parallel surfaces of the body of semiconductor material, said support plates fabricated of an electrically conductive high strength material having a coefficient of thermal expansion substantially equal to that of the semiconductor material, said first support plate bonded to said body of semiconductor material along the first surface thereof, said second support plate not being bonded to said body of semiconductor material but merely in pressure contact therewith to prevent damage to the body of semiconductor material due to stresses that would be induced by the thermal expansions of both support plates and body of semiconductor material when the semiconductor device is operating under normal conditions if both support plates and body of semiconductor material were bonded together, said integral power semiconductor device unit further including first and second cup-like members fabricated of a good thermally and electrically conductive material and having outer bottom surfaces respectively in pressure contact with second major surfaces of said first and second support plates, and creepage path lengthening means formed along side wall portions of said cup-like members for increasing the creepage path across said integral power semiconductor device unit, said power semiconductor device defined as developing a thermal density of at least 100 watts per square inch of surface area, first and second relatively thin pressure plates having first major surfaces respectively in pressure contact with inner bottom surfaces of said first and second cup-like members, mean for clamping said first and second pressure plates together to obtain a pressure in the order of 2,000 lbs. per square inch against said semiconductor device and for providing easy removal of said integral power semiconductor device unit from the assembly, means for connecting a pair of electrical conductors to said assembly or supplying electrical power to said power semiconductor device, a first long nonwicked gravity-return heat pipe having an open evaporator section end enclosed by and connected to said first pressure plate along a side wall portion thereof, a second major surface of said first pressure plate functioning as a first evaporating surface of the first heat pipe in close proximity to the heat-emitting power semiconductor device for decreasing the steady-state thermal resistance as well as decreasing transient temperature rise for long term heat overloads to obtain improved single-sided vaporization cooling of the device superior to that obtained with conventional finned heat sinks or with wicked heat pipes, a second long nonwicked gravity-return heat pipe having an open evaporator section end enclosed by and connected to said second pressure plate along a side wall portion thereof, a second major surface of said second pressure plate functioning as a second evaporating surface of the second heat pipe in close proximity to the heat-emitting power semiconductor device to obtain improved double-sided vaporization cooling of the device superior to that obtained with conventional finned heat sinks or with wicked heat pipes, said nonwicked heat pipes being substantially greater in length and having improved cooling characteristics than wicked heat pipes which are limited in length due to wick pumping losses, said first and second nonwicked gravity-return heat pipes comprise first and second enclosed elongated hollow chambers having evaporator sections at first ends thereof respectively defined by said first and second pressure plates and condenser sections at seconds ends thereof remote from the first ends, a two-phase fluid coolant contained within said chambers and being of sufficient volume in the liquid state to cause full immersion of at least the heated portion of the evaporation surface enhancing means in the liquid coolant, and means connected only along the second major surfaces of said first and second pressure plates for enhancing the evaporation surfaces thereof and thereby increasing the rate of heat transfer from the pressure plates to the liquid coolant in the heat pipes which is vaporized, said clamping means comprising a relatively large diameter threaded connection between said first and second heat pipes, said large diameter threaded connection comprising a first collar member joined to the outer surface of a side wall of said first heat pipe adjacent the first end thereof, said first collar being threaded along its outermost surface, a second collar member joined to the outer surface of a side wall of said second heat pipe adjacent the first end thereof, a rotatable sleeve member retained along the outer surface of the side wall of said second heat pipe and retained longitudinally therealong by said second collar member, said sleeve member having a projecting portion, and a U-shaped hollow cylindrical member having a first end portion threaded for mating with the threaded portion of said first collar member, and a second end portion bearing against an outermost side of the projecting portion of said sleeve member, said U-shaped hollow cylindrical member being rotatable in a first direction for applying pressure against said integral power semiconductor device unit, and rotatable in a second direction or easy removal of said integral power semiconductor device unit from the assembly, said large diameter threaded connection providing a high degree of self-alignment of said pressure plates and integral power semiconductor device unit.

2. The heat-pipe cooled power semiconductor device assembly set forth in claim 1 wherein at least a substantial portion of each of said first and second heat pipes is oriented at an angle greater than 0° with respect to the horizontal.

3. The heat-pipe cooled power semiconductor device assembly set forth in claim 1 and further comprising a third electrical conductor connected to said body of semiconductor material.

4. The heat-pipe cooled power semiconductor device assembly set forth in claim 1 wherein the condenser sections of said chambers are provided with cooling fins along the outer surfaces thereof for increasing the rate of heat transfer to ambient air surrounding said assembly.

5. The heat-pipe cooled power semiconductor device assembly set forth in claim 6 wherein said pressure plates are fabricated of a thermally conductive material.

6. The heat-pipe cooled power semiconductor device assembly set forth in claim 6 wherein said pressure plates are each of thickness in the range of 100 to 300 mils.

7. The heat-pipe cooled power semiconductor device assembly set forth in claim 1 wherein said evaporation surface enhancing means is a porous metallic structure which is sintered to the second major surface of said pressure plates.

8. The heat-pipe cooled power semiconductor device assembly set forth in claim 7 wherein said porous metallic structure is of uniform thickness in the range of 10 to 50 mils, and the metal thereof is nickel.

9. The heat-pipe cooled power semiconductor device assembly set forth in claim 1 wherein said evaporation surface enhancing means is an irregular surface formed on the second major surface of said pressure plates for increasing the surface area thereof.

10. The heat-pipe cooled power semiconductor device assembly set forth in claim 9 wherein said irregular surface consists of small fins formed of a heat conductive material.

11. The heat-pipe cooled power semiconductor device assembly set forth in claim 4 and further comprising an electrically insulating collar connected between the condenser section and evaporating section of each of said nonwicked gravity-return heat pipes for electrically isolating the finned portion of the heat pipes from the power semiconductor device.

12. The heat-pipe cooled power semiconductor device assembly set forth in claim 6 wherein said creepage path lengthening means comprise a unitary layer of an electrically insulating material formed along outer side wall surfaces of said first and second cup-like members.

13. The heat-pipe cooled power semiconductor device assembly set forth in claim 12 wherein the unitary layer is of a ceramic composition, and provides a hermetic seal around said power semiconductor device.

14. The heat-pipe cooled power semiconductor device assembly set forth in claim 12 wherein the unitary layer is of a rubber composition and fills the entire void between said first and second cup-like members.

* * * * *